United States Patent
Barth et al.

(10) Patent No.: US 7,948,064 B2
(45) Date of Patent: May 24, 2011

(54) SYSTEM ON A CHIP WITH ON-CHIP RF SHIELD

(75) Inventors: Hans-Joachim Barth, Munich (DE); Andre Hanke, Unterhaching (DE); Snezana Jenei, Munich (DE); Oliver Nagy, Vienna (AT); Jiro Morinaga, Neufahrn (JP); Bernd Adler, Neubiberg (DE); Heinrich Koerner, Bruckmuehl (DE)

(73) Assignee: Infineon Technologies AG, Neubiberg (DE)

( * ) Notice: Subject to any disclaimer, the term of this patent is extended or adjusted under 35 U.S.C. 154(b) by 205 days.

(21) Appl. No.: 12/242,698

(22) Filed: Sep. 30, 2008

(65) Prior Publication Data

US 2010/0078779 A1    Apr. 1, 2010

(51) Int. Cl.
*H01L 23/552* (2006.01)
*H01L 21/71* (2006.01)
(52) U.S. Cl. .......... 257/659; 438/655; 257/E23.114
(58) Field of Classification Search .......... 257/659, 257/E23.114; 438/655
See application file for complete search history.

(56) References Cited

U.S. PATENT DOCUMENTS

| | | | |
|---|---|---|---|
| 5,202,754 | A | 4/1993 | Bertin et al. |
| 5,955,789 | A | 9/1999 | Vendramin |
| 6,486,534 | B1 | 11/2002 | Sridharan et al. |
| 6,548,391 | B1 | 4/2003 | Ramm et al. |
| 6,618,267 | B1 | 9/2003 | Dalal et al. |
| 6,686,649 | B1 | 2/2004 | Mathews et al. |
| 6,947,295 | B2 | 9/2005 | Hsieh |
| 7,033,927 | B2 | 4/2006 | Cohen et al. |
| 7,427,803 | B2 | 9/2008 | Chao et al. |
| 7,619,297 | B2 | 11/2009 | Wang |
| 2004/0195591 | A1 | 10/2004 | Gehman et al. |
| 2006/0186513 | A1 | 8/2006 | Kitaguchi |
| 2006/0192265 | A1 | 8/2006 | Hsu |
| 2006/0229683 | A1 | 10/2006 | Wang et al. |

*Primary Examiner* — Jarrett J Stark
*Assistant Examiner* — Lawrences Tynes, Jr.
(74) *Attorney, Agent, or Firm* — Slater & Matsil, L.L.P.

(57) ABSTRACT

Structures of a system on a chip are disclosed. In one embodiment, the system on a chip (SoC) includes an RF component disposed on a first part of a substrate, a semiconductor component disposed on a second part of the substrate, the semiconductor component and the RF component sharing a common boundary, and a conductive cage disposed enclosing the RF component. The conductive cage shields the semiconductor component from electromagnetic radiation originating from the RF circuit.

30 Claims, 17 Drawing Sheets

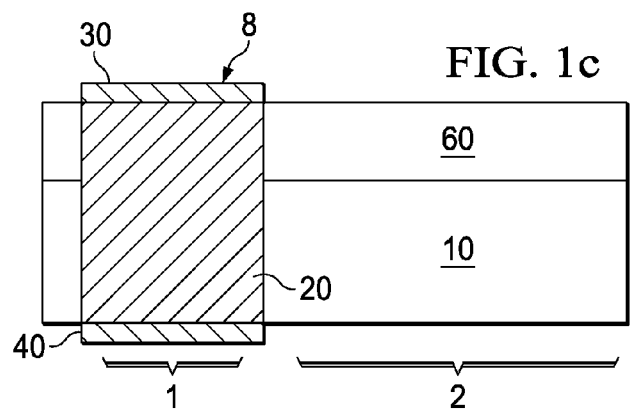
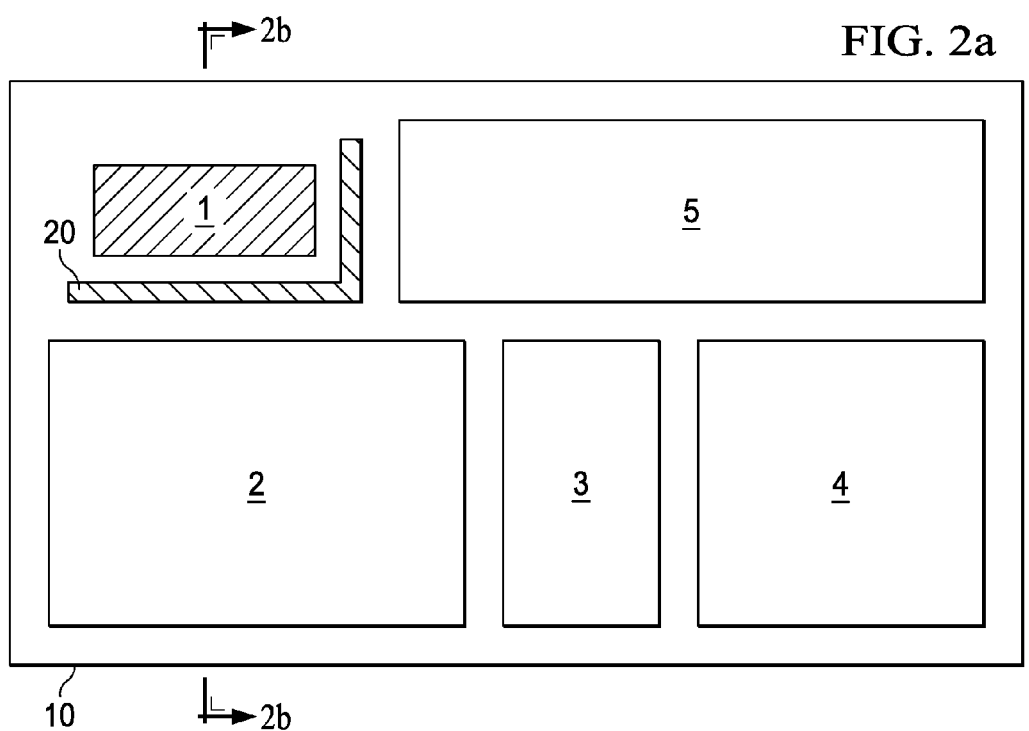

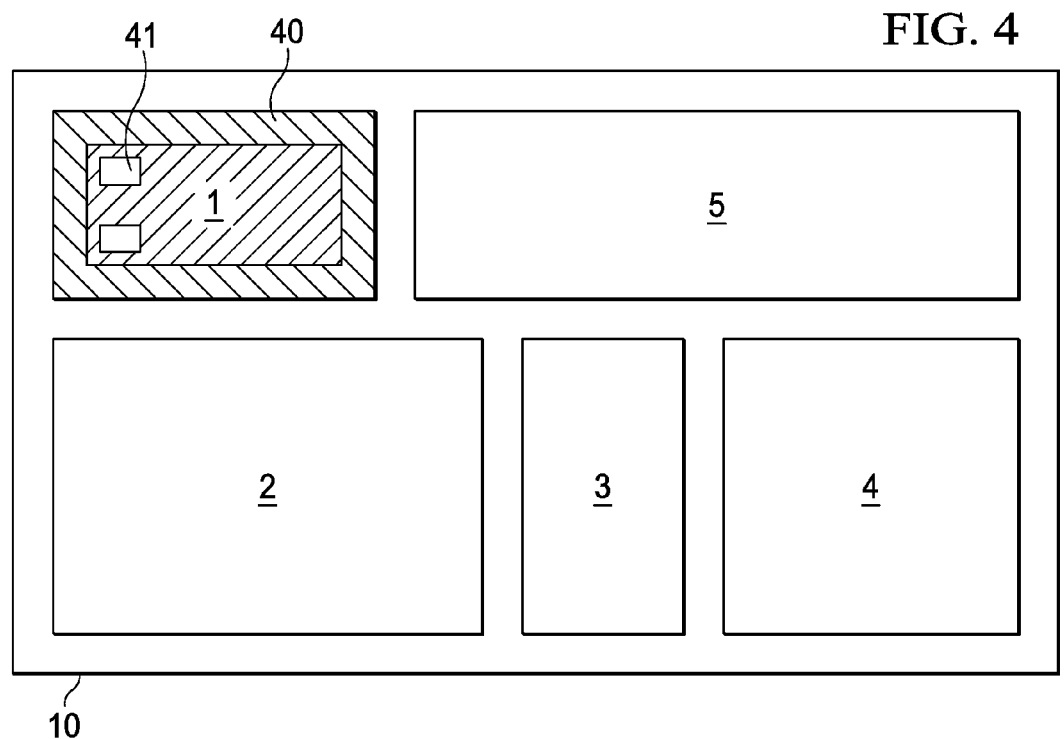
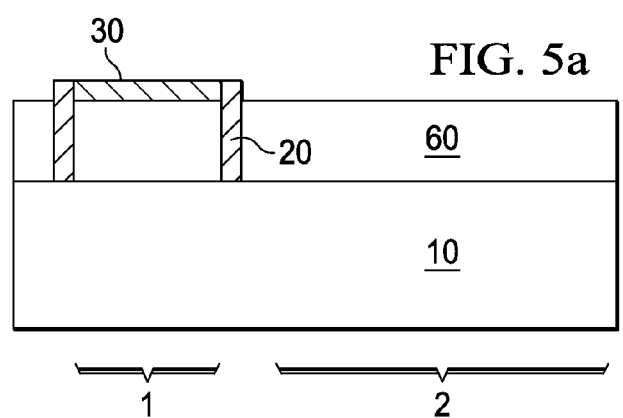

SYSTEM ON A CHIP WITH ON-CHIP RF SHIELD

CROSS-REFERENCE TO RELATED APPLICATIONS

This patent application relates to the following commonly assigned co-pending applications concurrently filed, each of which is hereby incorporated herein by reference:

| Pat. No. | Ser. No. | Filing Date | Issue Date | Attorney docket number |
|---|---|---|---|---|
| | | | | INF 2008 P 50668 US |
| | | | | INF 2008 P 50669 US |
| | | | | INF 2008 P 50762 US |
| | | | | INF 2008 P 50764 US |

TECHNICAL FIELD

This invention relates generally to electronic devices, and more particularly to system on chip with RF shields.

BACKGROUND

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

There is a demand in semiconductor device technology to integrate many different functions on a single chip, e.g., manufacturing analog and digital circuitry on the same die. In such applications, many different components such as digital and analog or RF circuitry are integrated into a single chip. However such integration creates additional challenges that need to be overcome. For example, integration of multiple components results in interference between various components. RF circuitry operating at high frequencies produces extraneous electromagnetic radiation that interferes with the operation of other components in the integrated system on chip. This problem deteriorates with subsequent technology generations as operating frequencies continually increase and distances on the chips decrease. Aggressive integration of multiple components in a single chip requires the need to eliminate such interference without a significant increase in production costs.

SUMMARY OF THE INVENTION

These and other problems are generally solved or circumvented, and technical advantages are generally achieved, by embodiments of the present invention.

Embodiments of the invention include structures for shielding semiconductor components on a system on a chip comprising an RF component from electromagnetic radiation originating from the RF circuitry of the RF component. In accordance with an embodiment of the present invention, the system on a chip comprises an RF component disposed on a first part of a substrate, a semiconductor component disposed on a second part of the substrate, the semiconductor component and the RF component sharing a common boundary, and a conductive cage enclosing the RF component.

The foregoing has outlined rather broadly the features of an embodiment of the present invention in order that the detailed description of the invention that follows may be better understood. Additional features and advantages of embodiments of the invention will be described herein, which form the subject of the claims of the invention. It should be appreciated by those skilled in the art that the concept and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention and the advantages thereof, reference is now made to the following descriptions taken in conjunction with the accompanying drawings, in which:

FIG. 1, which includes FIGS. 1a-1c, illustrates a system on a chip with a conductive shield formed around the RF component, wherein FIG. 1a illustrates a top cross-sectional view, FIG. 1b illustrates a vertical cross-sectional view of the system on a chip, and FIG. 1c illustrates a vertical cross sectional view along the conductive shield, in accordance with an embodiment of the invention;

FIG. 2, which includes FIGS. 2a and 2b, illustrates a system on a chip with a conductive shield formed only around the inside edges of the RF component, wherein FIG. 2a illustrates a top cross-sectional view, and FIG. 2b illustrates a vertical cross-sectional view of the system on a chip, in accordance with an embodiment of the invention;

FIG. 4 illustrates a bottom view of a system on a chip with a conductive shield formed under the RF component, in accordance with an embodiment of the invention;

FIG. 5, which includes FIGS. 5a-5d, illustrates a system on a chip with a partially conductive shield, wherein FIG. 5a illustrates a conductive shield formed on the top portion of the chip, FIG. 5b illustrates a conductive shield formed on the bottom portion of the chip, FIG. 5c illustrates a conductive shield formed on the top portion of the chip and penetrating partially into the substrate, and FIG. 5d illustrates a conductive shield partially formed on the top portion of the chip and the substrate, in accordance with an embodiment of the invention;

FIG. 6, which includes

FIG. 7, which includes

FIG. 8, which includes

FIG. 9, which includes

FIG. 11, which includes FIGS. 11a-11c, illustrates a structural embodiment illustrating an RF shield comprising both on-chip and off-chip components, wherein FIG. 11a illustrates a cross sectional view and FIGS. 11b and 11c illustrate top views.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a structure comprising an RF shield. In various embodiments, the invention avoids the use of separate shielding layers or structures formed separately and disposed outside the chip (for example, during packaging). The present invention avoids expensive fabrication costs by integrating the RF shield on-chip rather than being separately attached to the chip. Further, being an integrated RF shield, the manufacturing steps are commonly shared with other components already being used in the fabrication of a system on chip (SoC). Although illustrated with respect to shielding adjacent components on the SoC, the invention may be applied to shielding single chips from adjacent chips.

According to SoC requirements, analog, RF, digital, and memory blocks all coexist on-chip while interacting minimally (such as generating minimal noise and being highly immune to received noise). In particular, as operating frequencies increase with scaling, RF components operating at high GHz frequencies emit electromagnetic radiation that interferes with other neighboring components. In various embodiments of the present invention, a conductive shield surrounds the RF components to minimize this interference. The conductive shield blocks out the electromagnetic radiation generated by the RF circuitry from reaching other components of the SoC.

Figure 1A:
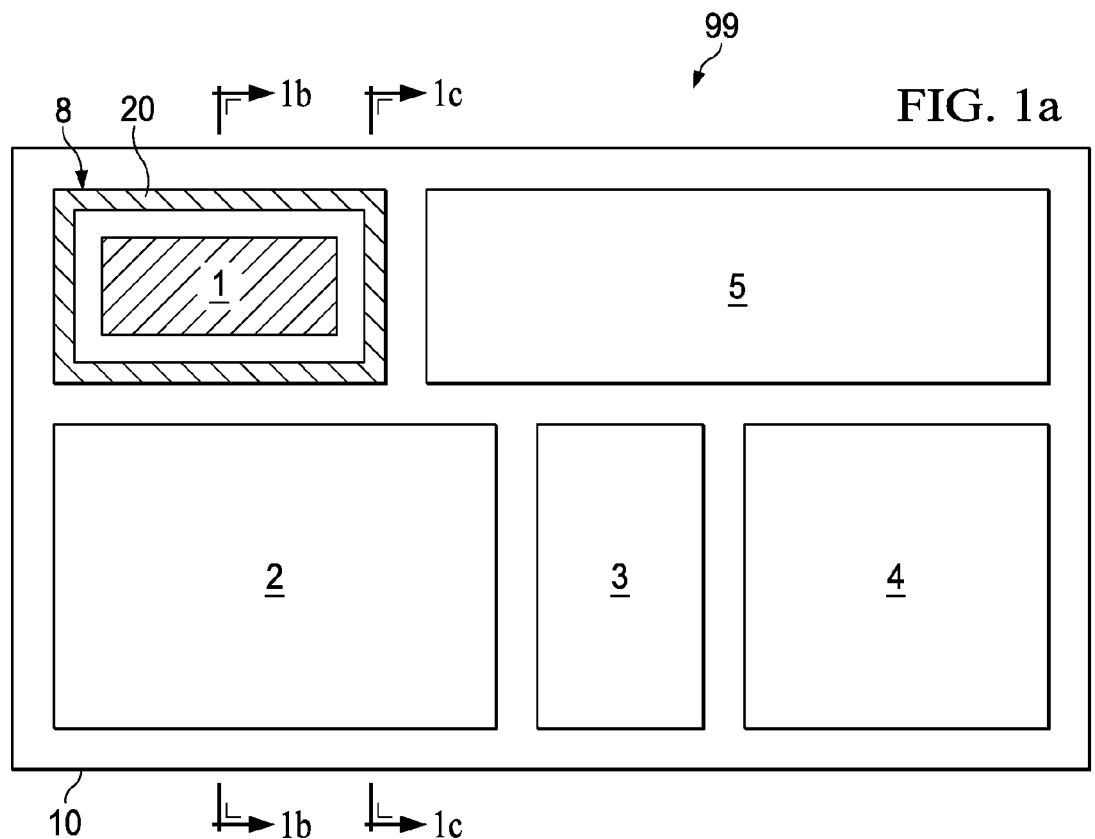

A structural embodiment of the invention illustrating a top view of a conductive cage will be first described using FIG. 1. Further embodiments of the structure will be described using FIG. 2. An embodiment of the invention illustrating a top cross-sectional view will be described using FIG. 3. An embodiment of the invention illustrating a bottom cross-sectional view will be described using FIG. 4. Vertical cross-sectional views of embodiments of the invention forming partial conductive cages will be described using FIGS. 5 and 6. An embodiment of a method of forming the conductive shield will be described with respect to FIGS. 7 and 9. A structural embodiment illustrating a side cross section of the RF shield will be described using FIG. 8.

An embodiment of the invention is illustrated in FIG. 1. A chip 99 comprises a substrate (workpiece) 10. Some suitable examples of the substrate 10 are bulk mono-crystalline silicon substrate (or a layer grown thereon or otherwise formed therein), a layer of (110) silicon on a (100) silicon wafer, a silicon on insulator (SOI) wafer, or a germanium-on-insulator (GeOI) wafer. In other embodiments, other semiconductors such as silicon germanium, germanium, gallium arsenide, indium arsenide, indium phosphide, indium gallium arsenide, indium antimonide or others can be used with the wafer. The substrate 10 also includes active components such as transistors or diodes, or passive components such as inductors, capacitors or resistors, among others. Active regions are disposed on a top surface of the substrate and comprise devices such as transistors, resistors, capacitors, diodes etc. Metallization levels are disposed over the top surface of the substrate 10.

The SoC 99 illustrated in FIG. 1 comprises an RF circuit 1 along with other components. In one embodiment, the SoC 99 comprises a digital logic component 2, an analog component 3, a non-volatile memory 4, and an SRAM component 5. In various embodiments, less or more components may be present.

Figure 1B:
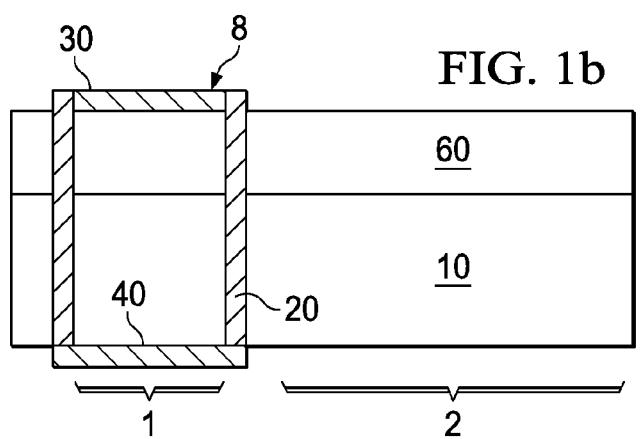

In various embodiments, electromagnetic radiation emitted by the RF component 1 is shielded by the RF shield 8. The RF shield 8 comprises an on-chip three dimensional structure enclosing the RF component 1, and is formed as part of the SoC 99. A vertical cross section of the RF shield is illustrated in FIGS. 1b and 1c. The RF shield 8 comprises vertical sections (fence 20) passing through the substrate 10 and interconnect layers 60. The interconnect layers 60 comprise the metallization layers and include interconnects connecting the circuitry of the devices. The interconnect layers 60 comprise metal lines and vias embedded in insulating layers. The RF shield comprises conductive materials and in various embodiments comprises vias and metal lines.

The fence 20 around the RF component 1 is disposed between the RF component 1 and adjacent components (for example, digital logic component 2). In various embodiments, this arrangement does not require use of additional chip area, and hence involves no additional area penalty. The vertical fence 20 also comprises openings for placing routing to adjacent components. In one embodiment, these routings are disposed in one or several of the interconnect layers 60, for example to connect the RF component 1 to the digital logic component 2, or to the analog component 3, or to the non-volatile memory 4, or to the SRAM component 5, or to several of the components mentioned before. In another embodiment, these routings are disposed in the substrate 10, for example, as conductive trenches coupling the RF component 1 with the adjacent components, for example digital logic component 2 or SRAM component 5.

In various embodiments, the RF shield 8 forms a Faraday cage around the RF component 1. When an RF signal or RF electromagnetic wave interacts with a conductive material, it creates oscillations of mobile charges (electrons) in the conductive material with the same frequency as the incoming RF frequency. The induced electric field cancels the electric field of the electromagnetic radiation thus minimizing the penetration of the lines through the conductive material.

The induced alternating electric currents are higher at the surface of the conductive material and decrease to the inside of the conductive material (skin effect). The skin effect is characterized by a skin depth. The skin depth depends strongly on the frequency of the incoming RF electromagnetic wave. Low frequencies have larger skin depth, while higher frequencies have shorter skin depth. The low resistance metals like silver, copper, gold, aluminum have the smallest skin depth for given RF frequencies, e.g. at 10 MHz the skin depth is of the order of 20-25 um, while for frequencies above 10 GHz the skin depth is less than 1 um. Hence, in various embodiments, the RF shield is formed from low resistance materials to minimize the penetration of the electromagnetic waves. Using low resistance materials for forming RF shield 8 enables using a thinner layer of conductive material. The resistivity of the metal line is preferably lower than about 5×10-6 Ohms-cm. Examples of such materials include copper, silver, gold, platinum, aluminum.

In one embodiment, the RF shield 8 comprises copper, aluminum, and/or tungsten. In other embodiments, other metals such as silver, gold, doped silicon or doped polysilicon, or combinations may be used. Metal barriers such as tantalum, tantalum nitride, titanium, titanium nitride, ruthenium, tungsten carbo-nitride (WCN), and/or tungsten nitride are used in some embodiments.

In various embodiments, the RF shield 8 is not a continuous plate, but rather a structure with gaps or openings between the conductive elements. The RF shield 8 is effective as long as the minimum distance between the conductive elements is less than the wavelength of the electro magnetic radiation. For example, an opening of about 30 mm can shield electromagnetic radiation at 10 GHz. Even at a frequency of 1000 GHz the openings can be smaller than 300 um to shield the radiation. Hence, openings less than 300 um are suitable, and openings less than 100 um are used in one embodiment. In different embodiments, the RF shield 8 comprises mesh, grids, and/or cage structures. In various embodiments, the RF shield 8 comprises a mesh like structure and comprises a pattern comprising rectangular, triangular, or other patterns. In various embodiments, the RF shield 8 is connected to a node coupled to ground potential.

In various embodiments, the RF shield 8 is built around the RF circuit 1 and based on a specific on-chip layout. In various embodiments, the RF shield 8 is fabricated using typical process modules and materials used in semiconductor manufacturing. In one embodiment, the on-chip RF shield 8 is fabricated using processes, for example, common to back end of the line flow. Although not shown vertical fences 20 comprise openings for electrical connections to neighboring circuits or to input/output sources such as power or ground potentials, or signal pads.

Figure 2B:
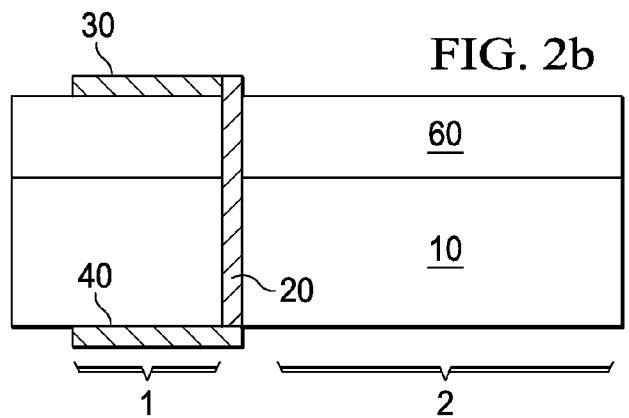

FIG. 2, which includes FIGS. 2a and 2b, illustrates an embodiment of the invention comprising an RF shield structure disposed only between RF circuitry and an adjacent component. In this embodiment, the fence 20 of the RF shield 8 is not formed on the outer edges of the RF circuit 1. Hence, the cost of fabrication of the RF shield 8 is reduced by eliminating it from non-essential regions. As illustrated in FIG. 2b, the vertical fence 20 along the interconnect layer 60 is avoided along the outer edges. This is possible if there are no sensitive semiconductor components adjacent to the radiation from the RF circuitry.

Figure 3:
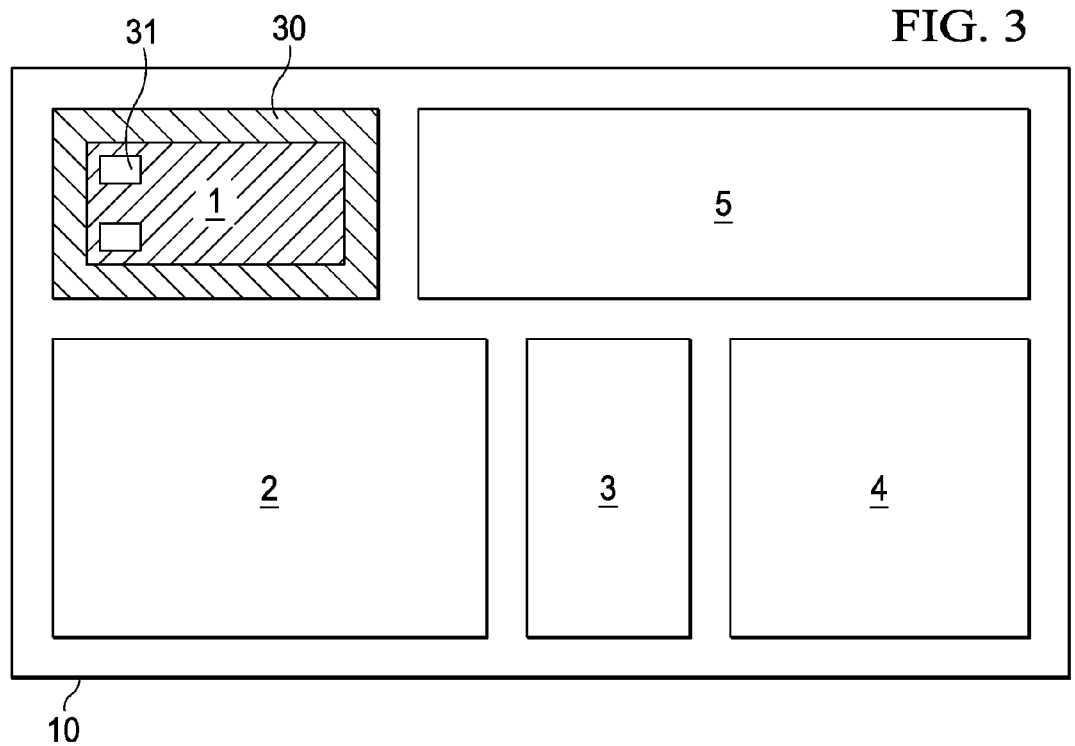
FIG. 3 illustrates a top view of a system on a chip with a conductive shield formed over the RF component, in accordance with an embodiment of the invention.

FIG. 3 illustrates a top view of the RF shield 8. The top shield 30 comprises a network or mesh like structure. The network or mesh structure comprises lines and openings. In various embodiments, the top openings 31 are large enough to accommodate input/output connections such as openings for flip chip bumps, flip chip pads, wire bonding pads, copper pillars, or wafer level ball grid array pads.

FIG. 4 illustrates a bottom view of the RF shield 8. Similar to the top shield 30, the bottom shield 40 comprises a network or mesh like structure. The network or mesh structure comprises lines and openings. In various embodiments, the bottom openings 41 are large enough to accommodate input/output connections such as openings for flip chip bumps, flip chip pads, wire bonding pads, copper pillars, or wafer level ball grid array pads.

Figure 5B:
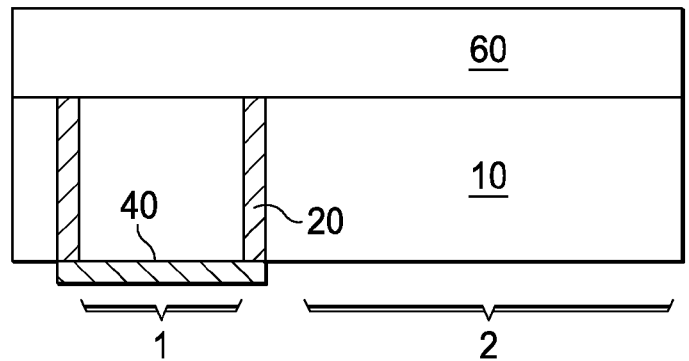
Figure 5C:
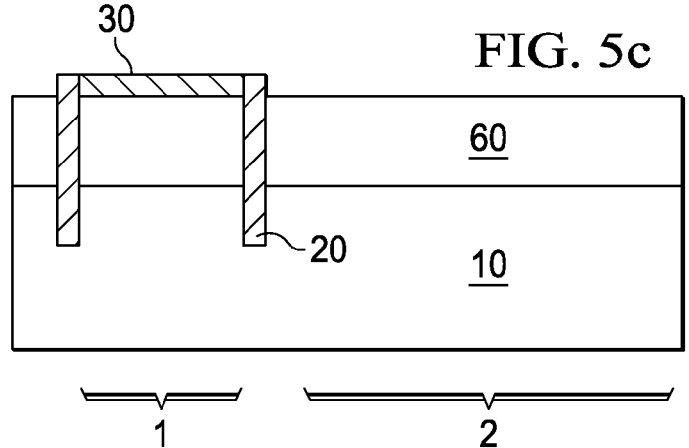
Figure 5D:
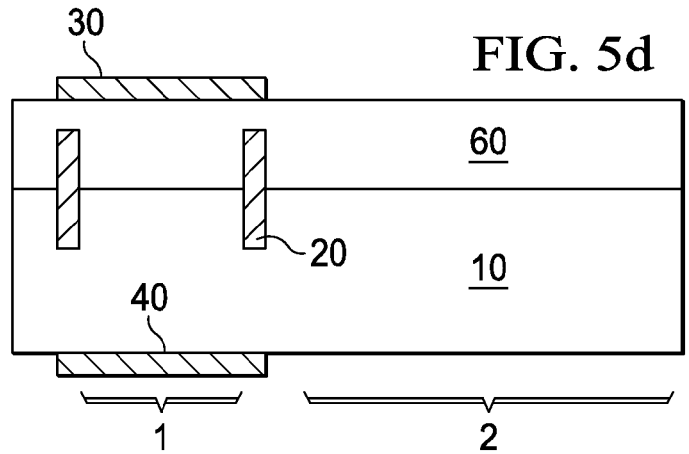

FIG. 5 illustrates cross-sectional views comprising partial cage structures. FIG. 5a illustrates an embodiment wherein the vertical fence 20 is not disposed in the substrate 10. Rather, the vertical fence 20 is entirely disposed above the substrate 10 in the interconnect layers 60. In contrast, in FIG. 5b, the vertical fence is disposed only in the substrate 10 and not in the interconnect layers 60. FIG. 5c illustrates an embodiment wherein the vertical fence 20 is disposed partially in the substrate 60. For example, in one embodiment, the vertical fence 20 comprises trench structures disposed in the substrate 10. As illustrated in FIG. 5d, in some embodiments, the vertical fence 20 may be disposed partially in the interconnect layer 60 and substrate 10. The vertical fence 20 in such embodiments can be connected to the top shield 30 through the interconnect layers 60 disposed over the RF circuitry.

Figure 6A:
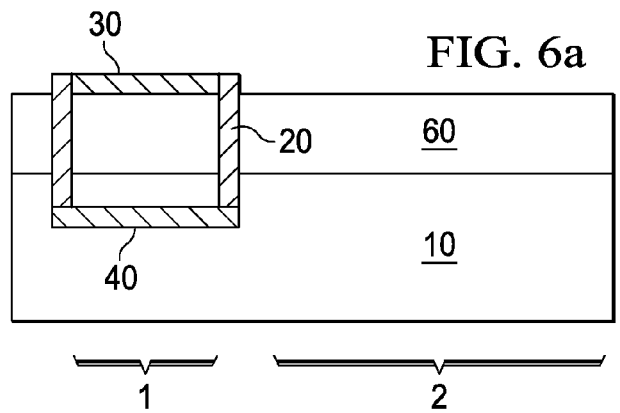
FIGS. 6a and 6b, illustrates a cross section of a system on chip with a bottom shield disposed inside a substrate, in accordance with an embodiment of the invention.
Figure 6B:
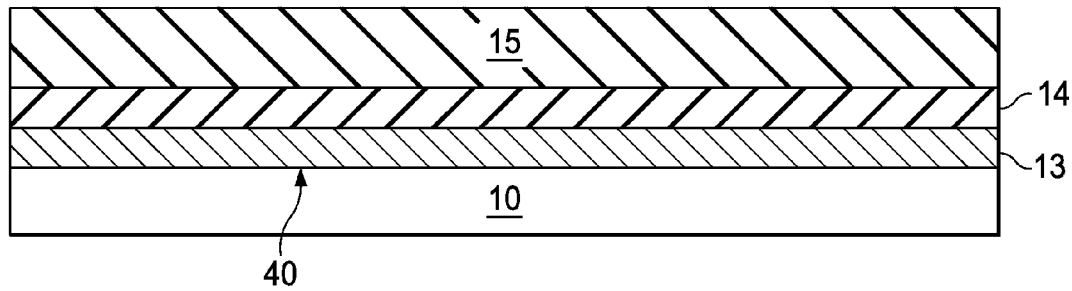

FIG. 6, which includes FIGS. 6a and 6b, illustrates a cross section of a system on chip with a bottom shield 40 disposed inside the substrate 10. FIG. 6a illustrates an embodiment using a silicon on insulator substrate with a bottom shield 40 disposed under the insulator layer. As illustrated in FIG. 6b, the substrate 10 comprises a metallic layer 13 forming the bottom shield 40. The buried oxide layer 14 of the silicon on insulator substrate is disposed over the metallic layer 13. The silicon layer 15 is disposed over the buried oxide layer 14.

Figure 7A:
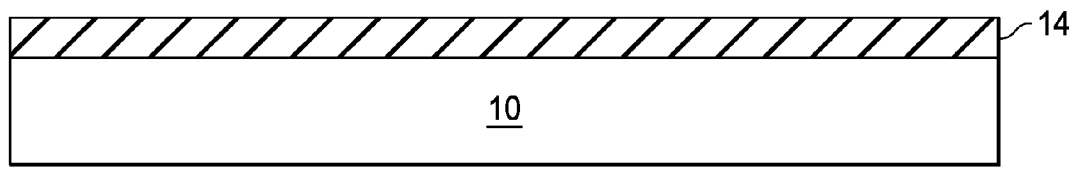
FIGS. 7a-7e, illustrates a method of forming the substrate to include the bottom shield, in accordance with an embodiment of the invention.
Figure 7B:
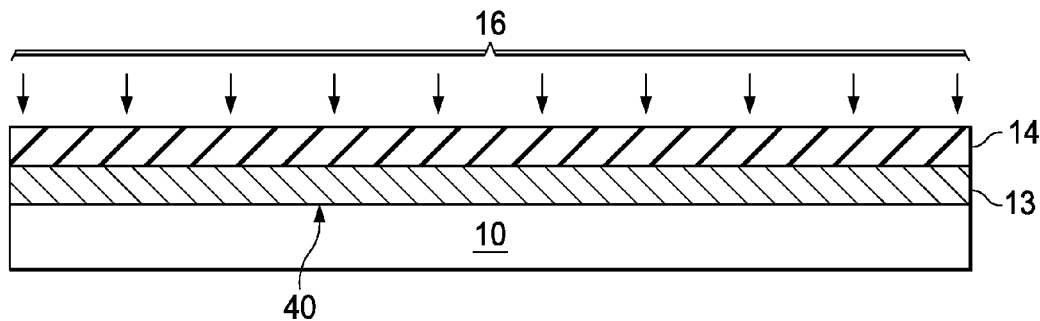
Figure 7C:
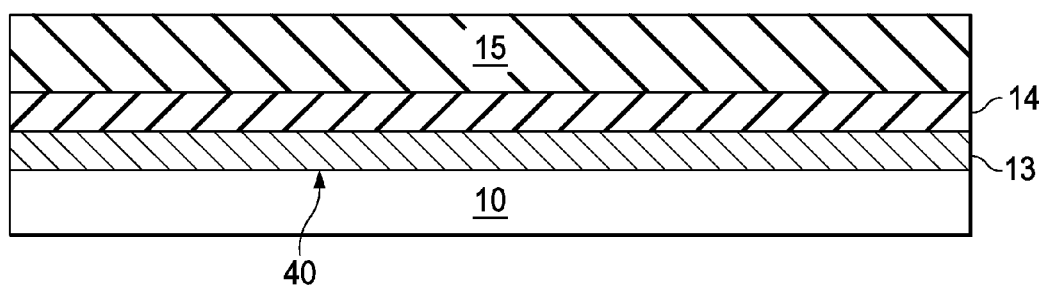
Figure 7D:
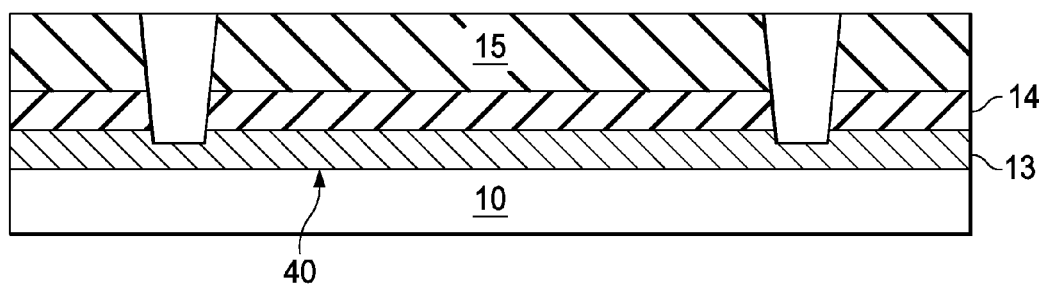
Figure 7E:
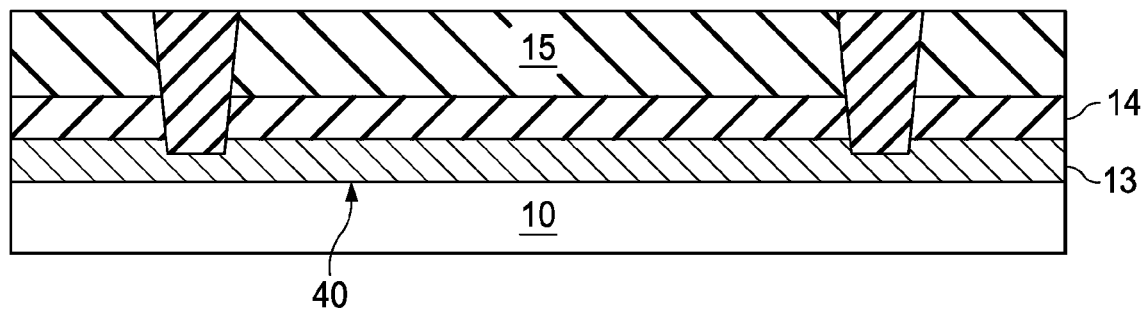

FIG. 7, which includes FIGS. 7a-7e, illustrates a method of forming the substrate 10 to include the bottom shield 40, in accordance with an embodiment of the invention. In various embodiments of the invention, the bottom shield 40 can be formed before, during, or after the front end of the line or back end of the line processes. In the embodiment described in FIG. 7, the bottom shield 40 is formed before the active regions are formed. In one embodiment, the oxide layer 14 is formed over a substrate (FIG. 7a). A subsequent implant 16 implants impurities into the substrate 10 through the oxide layer 14 (FIG. 7b). The implant 16 comprises metallic atoms that form a conductive layer under the oxide layer 14. The metallic layer 13 has a low resistivity and operates as the bottom portion of the RF shield 8. In another embodiment, the implant 16 comprises dopant atoms that form a conductive layer with a low resistivity. In such an embodiment, the conductive dopant layer forms the bottom portion of the RF shield 8. Subsequent processing continues to form the silicon on insulator wafer containing the bottom shield 40 (FIG. 7c). Subsequently, deep trenches are etched into the substrate using for example, a reactive ion etching process (FIG. 7d). The deep trenches are subsequently filled with a dielectric liner and a conductive fill material forming the vertical shield (FIG. 7e).

In other embodiments, the vertical fence comprises structures and methods of forming the structures as detailed in co-pending disclosures, incorporated by reference: application Ser. No. 12/242,487; filed: Sep. 30, 2008; application Ser. No. 12/242,688; filed: Sep. 30, 2008; and application Ser. No. 12/242,521; filed: Sep. 30, 2008.

Figure 8A:
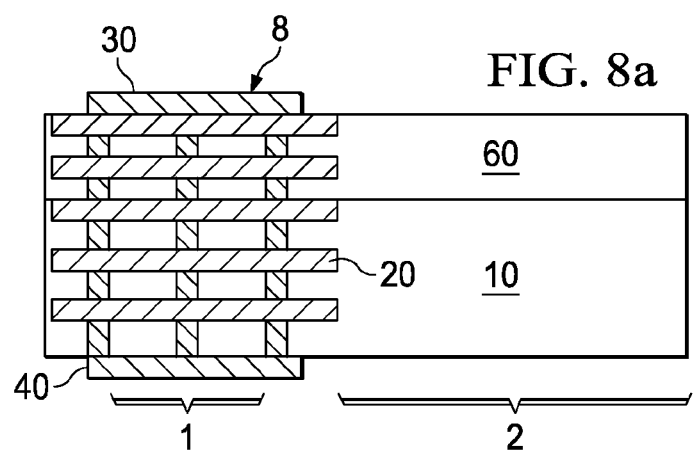
FIGS. 8a-8f, illustrates a structural embodiment illustrating a side cross section of the RF shield.
Figure 8B:
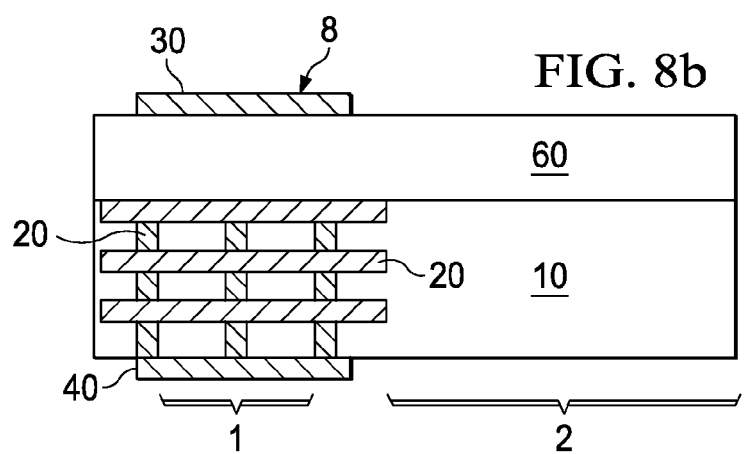
Figure 8C:
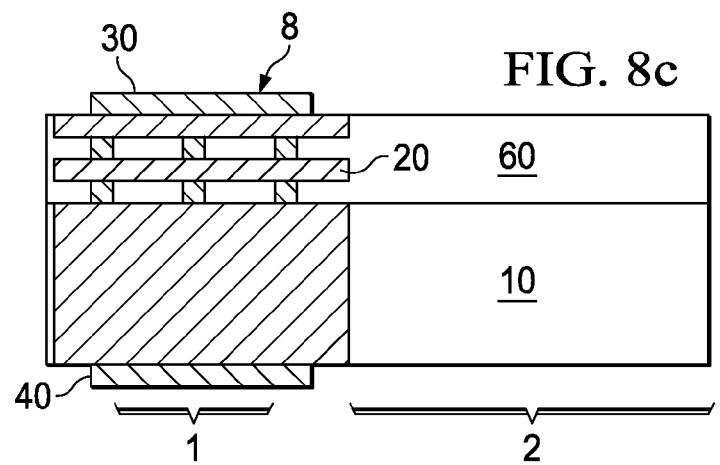

FIG. 8, which includes FIGS. 8a-8f, illustrates the cross sectional view of the fence of the RF shield. In various embodiments, the vertical fence 20 can comprise different structures. Referring to FIG. 8a, the vertical fence comprises a mesh like structure with conductors formed in the interconnect layer 60 as well as a fence like structure in the substrate 10. In different embodiments, this mesh structure is formed partially, for example, only in the substrate 10 (FIG. 8b). In the embodiment illustrated in FIG. 8c, the mesh structure is formed in the interconnect layer 60 whereas the substrate is filled to be single line or trench structure.

Figure 8D:
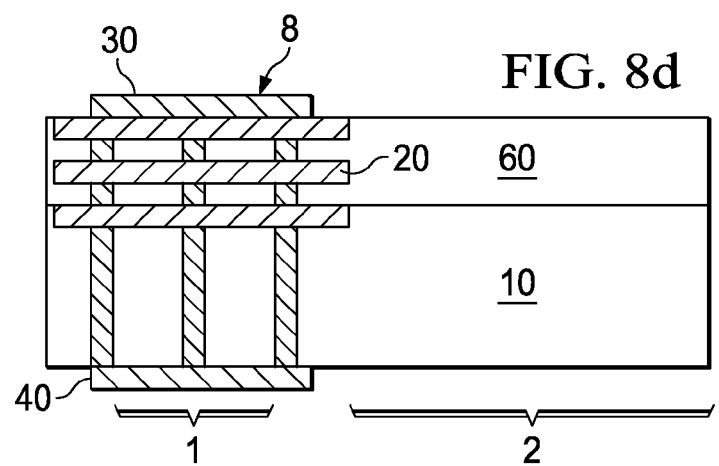
Figure 8E:
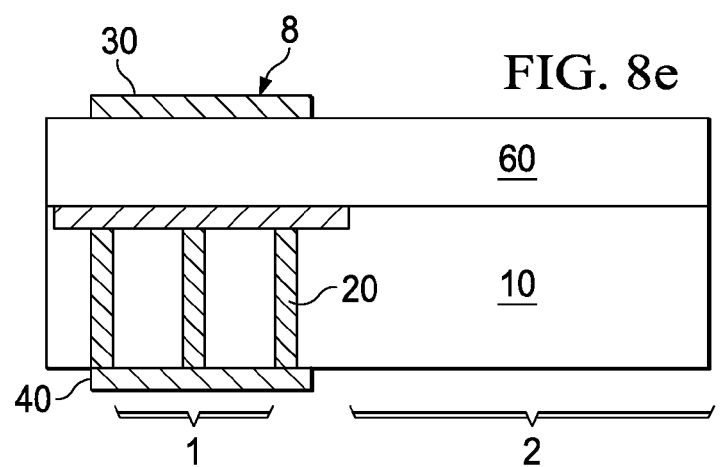
Figure 8F:
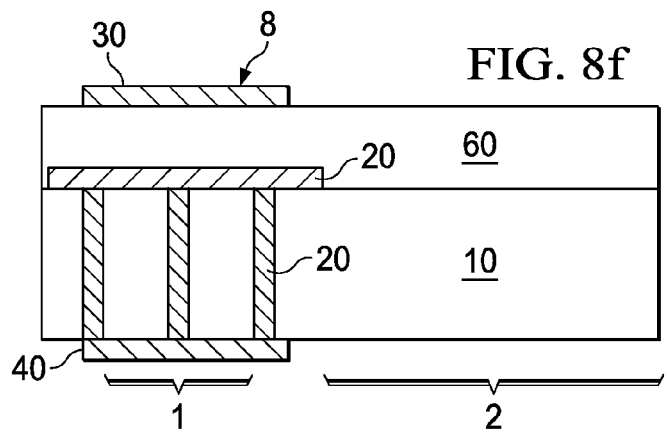

FIGS. 8d-8e illustrate embodiments wherein the vertical fence 20 comprise partially formed mesh structures. In FIG. 8d, the vertical fence 20 comprises only a single horizontal layer disposed in the substrate 10. This single horizontal layer is disposed immediately adjacent a top surface of the substrate 10. Similarly, in FIG. 8e, the vertical fence 20 is formed only in the substrate 10 and comprises only a single horizontal layer. In FIG. 8*f*, the vertical fence 20 comprises vertical sections in the substrate 10 but no horizontal layers. However, as illustrated in FIG. 8*e*, a single horizontal layer is disposed over the substrate 10.

Figure 9A:
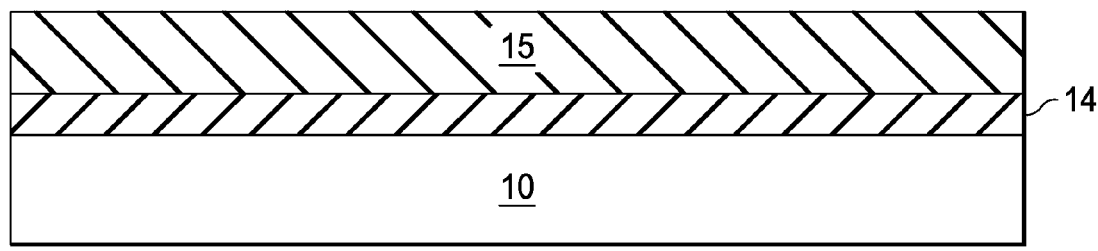
FIGS. 9a-9g, illustrates a method of forming the substrate to include the bottom shield, in accordance with an embodiment of the invention.
Figure 9B:
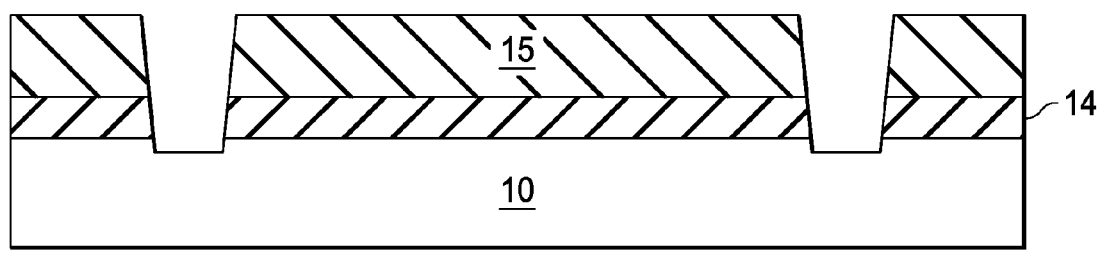
Figure 9C:
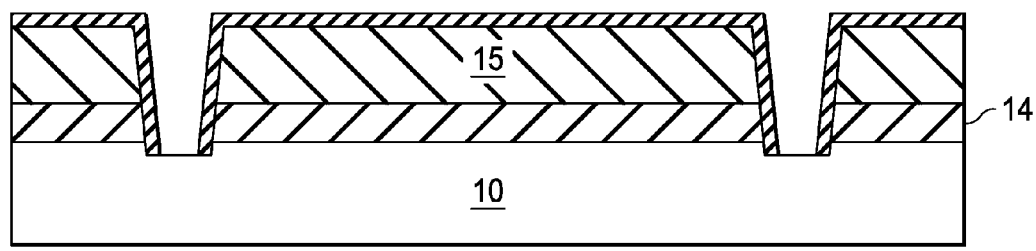
Figure 9D:
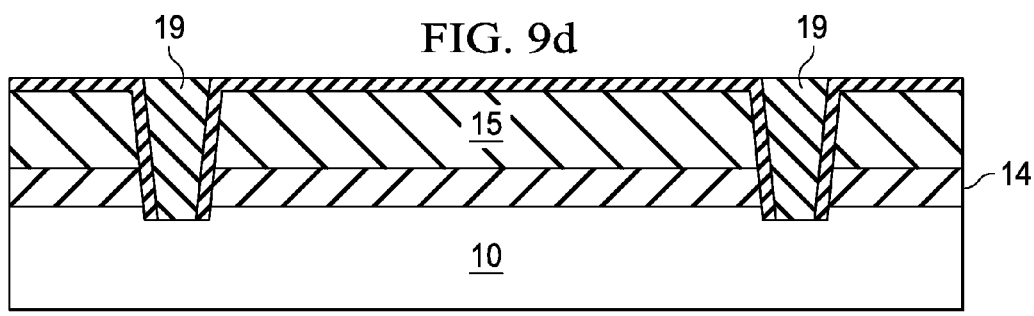
Figure 9E:
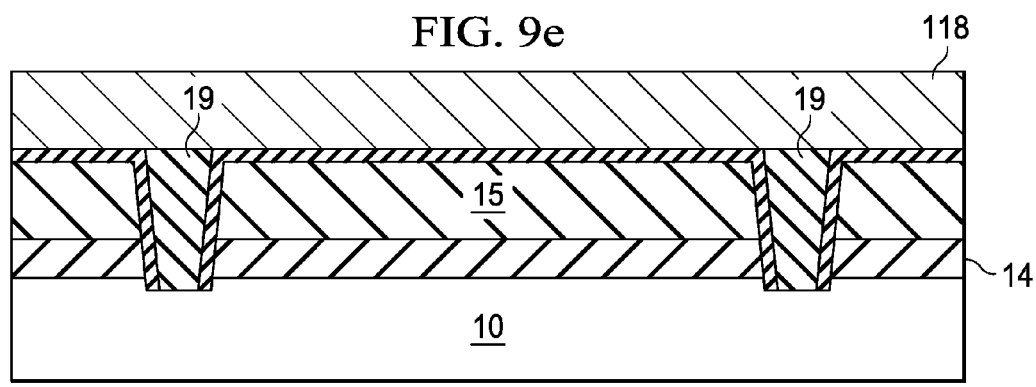
Figure 9F:
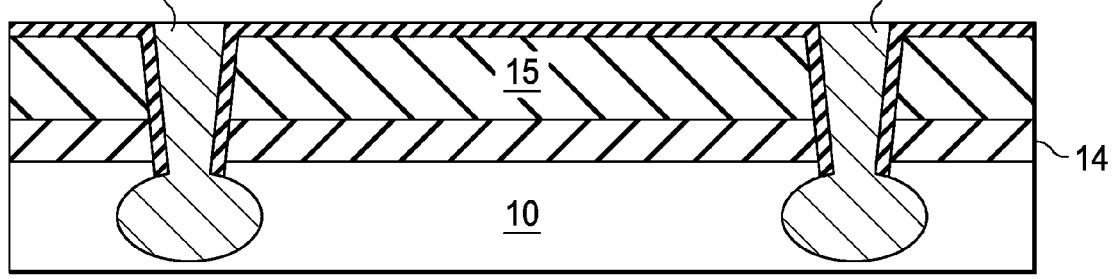
Figure 9G:
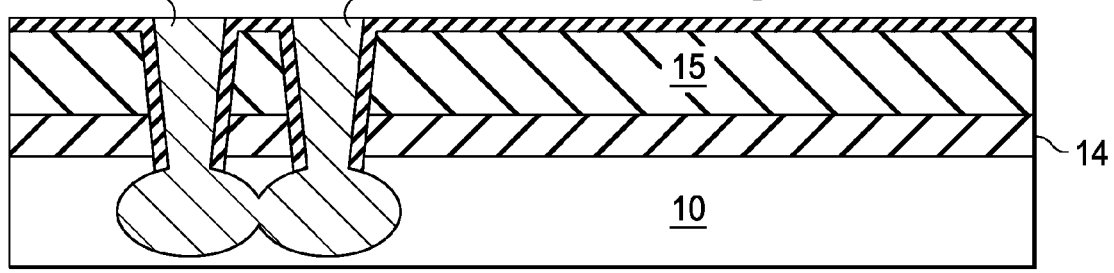
Figure 10:
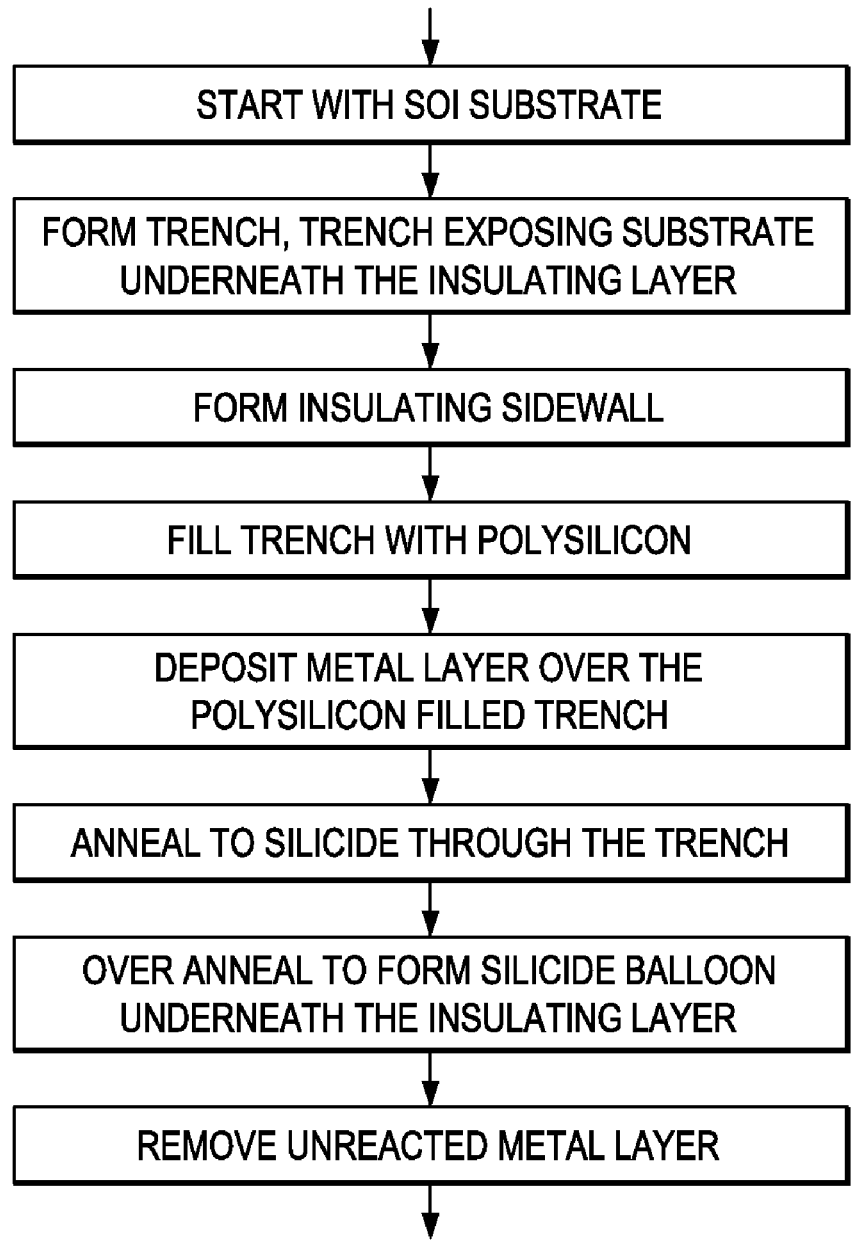
FIG. 10 illustrates a flow chart for process step described in FIG. 9, in accordance with an embodiment of the invention.

FIG. 9 along with FIG. 10 describes an embodiment of forming the RF shield 40. In one embodiment, a substrate 10 comprises a silicon on insulator is used. As illustrated in FIG. 9*a*, the silicon on insulator comprises a silicon layer 15 disposed over a buried oxide layer 14. In various embodiments, at this stage in the process, the front end processes are completed and active devices fabricated.

A deep trench is formed into the substrate, the deep trench etching through the buried oxide layer 14 and stopping on the underlying silicon substrate 10 (FIG. 9*b*). Referring to FIG. 9*c*, an insulating layer comprising a diffusion barrier is deposited and etched to form a sidewall. In some embodiments, a separate diffusion barrier is deposited. In one embodiment, an oxide liner or nitride liner is deposited that forms both the insulating layer and the diffusion barrier. The deep trench is filled with polysilicon layer 19 and planarized as shown in FIG. 9*d*. A silicide metal layer 119 is deposited over the filled polysilicon layer 19 (FIG. 9*e*). In various embodiments, the silicide metal layer 119 comprises a metal that forms a conductive metal silicide upon annealing. In various embodiments, the silicide metal layer 119 comprises nickel, cobalt, gold, silver, platinum, titanium.

Referring to FIG. 9*f*, a subsequent anneal drives-in metal atoms from the metallic layer 119 into the polysilicon layer 19 to form a metal silicide. A further drive-in silicides the silicon underneath the buried oxide layer 14 as the insulating layer is not formed on the bottom of the deep trench. A distance (pitch) between adjacent deep trenches can be adjusted to merge the bottom balloon regions for improved coupling and shielding (FIG. 9*g*). The conductive deep trenches are electrically coupled to a node coupled to a ground potential. In some embodiments, an additional implant may be performed in an earlier step to form a metal diffusion enhancement layer under the buried oxide layer 15. For example, residual implant defects may be generated to facilitate and modulate silicide formation laterally. Embodiments of the invention also include a combination of the embodiment described in FIG. 7 with the embodiment described in FIG. 9 to form both a conductive balloon layer underneath the buried oxide layer 14 and metallic layer 13.

Figure 11A:
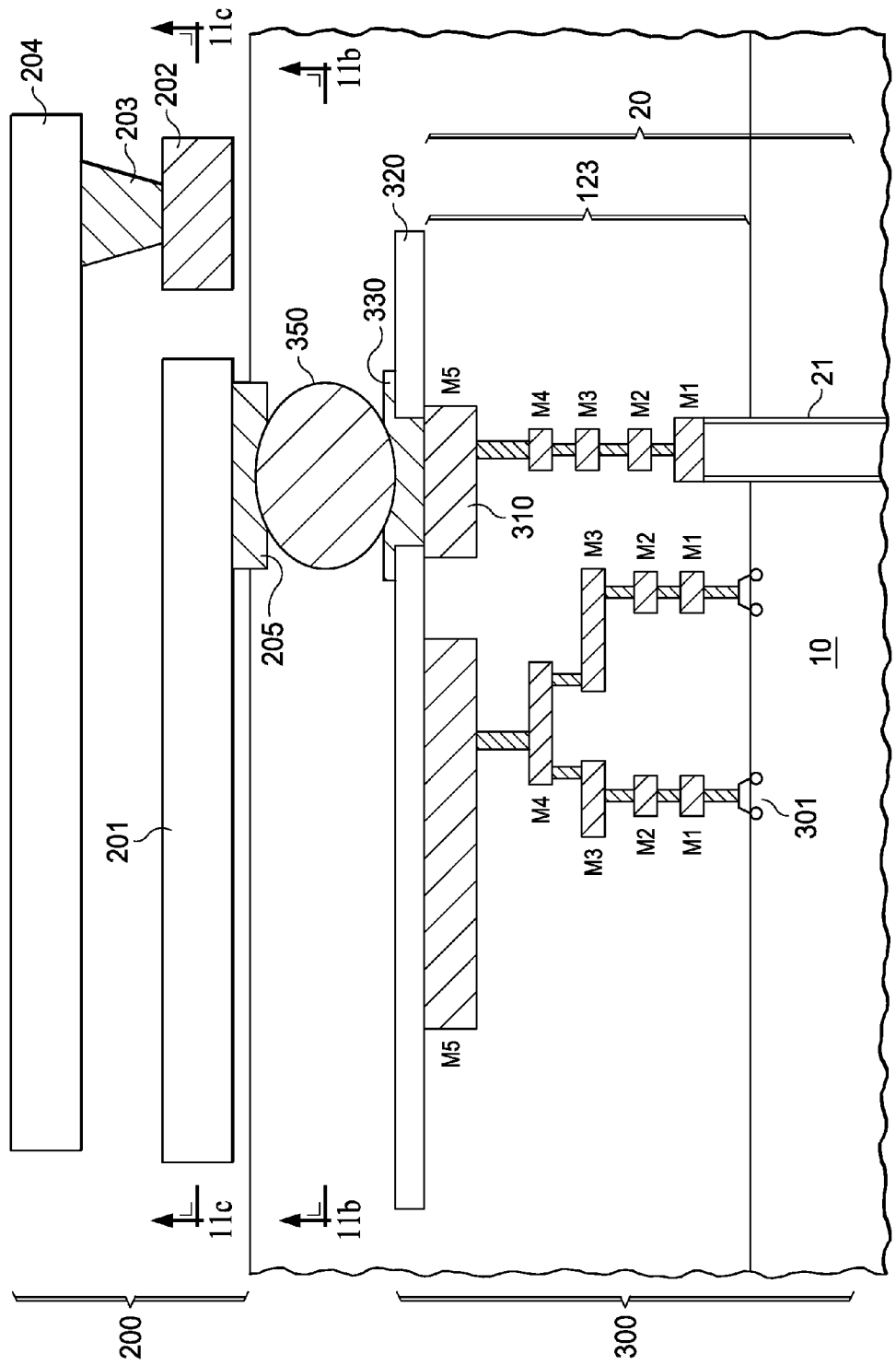
Figure 11B:
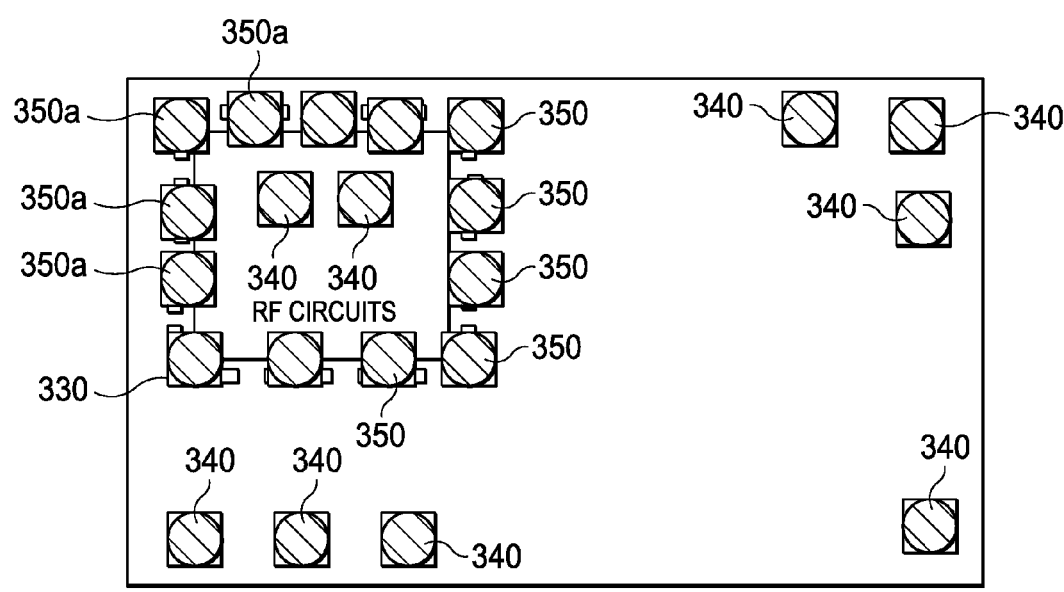
Figure 11C:
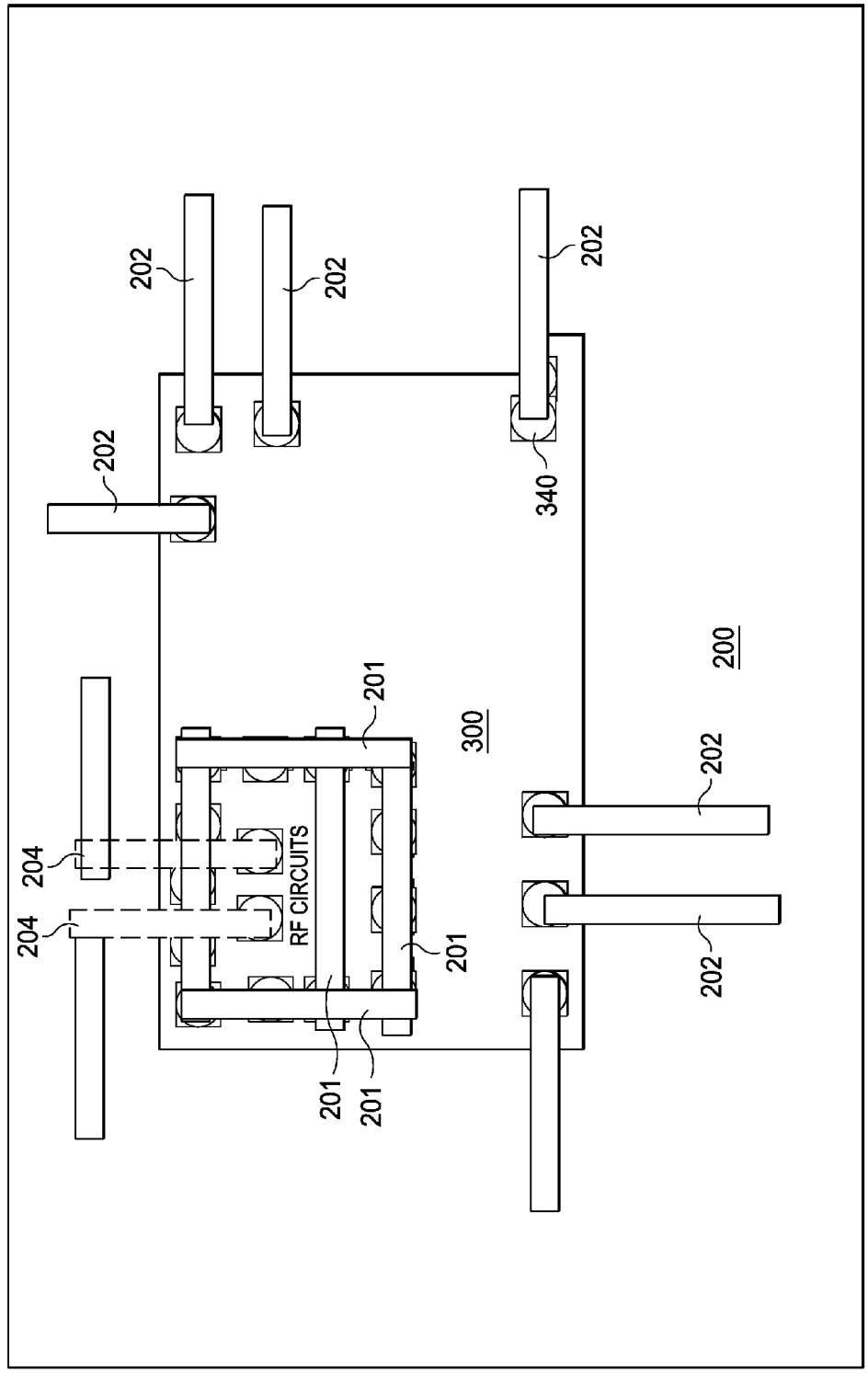

An embodiment of the invention is described using FIG. 11, which includes FIGS. 11*a*-11*c*, wherein FIG. 11*a* illustrates a cross sectional view and FIGS. 11*a* and 11*b* illustrate a top view.

Referring to FIG. 11*a*, a chip 300 is disposed on a board 200. In various embodiments, an RF shield 8 is formed as an on-chip and off-chip electromagnetic shield. For example, in one embodiment, the RF shield 8 is partly built on-chip, comprising wafer backside metallization, through silicon via 21, and interconnect metallization (interconnect RF barrier 123). The chip comprises active circuitry including active devices 301 disposed in a substrate 10. The active devices 301 are coupled through metallization levels disposed above the substrate 10. For example, in one embodiment, the active devices 301 are coupled through five metal levels: first, second, third, fourth and fifth metal levels (M1, M2, M3, M4, and M5).

Embodiments of the through silicon via 21 are described in co-pending application filed on Sep. 30, 2008; application Ser. No. 12/242,521. Similarly, embodiments of the interconnect RF barrier 123 are described in co-pending application filed on Sep. 30, 2008; application Ser. No. 12/242,556. Embodiments describing the wafer backside metallization are described in co-pending application filed on Sep. 30, 2008; application Ser. No. 12/242,487.

A passivation layer is disposed over the interconnect metallization levels. The on chip part of the RF shield 8 (for example, interconnect RF barrier 123) is coupled to the off-chip part of the RF shield 8 through a pad on the last metal level 310. An under bump metallization 330 is disposed over the pad on the last metal level 310 and disposed in the openings between the passivation layer 320. An RF shield interposer 350 couples the pad on the board with the under bump metallization 330.

The off-chip part of the RF shield 8 comprises a first board metal line 201 disposed on the board 200. The board 200 comprises second and third board metal lines 202 and 204 coupling active devices on the chip 300 to other chips or systems on the board. The board metal lines 202 and 204 are also providing power/ground and electrical signals to the chip 300. In some embodiments, the board metal lines 202 and 204 may even connect different functional components or functional units on the chip 300 and operate the chip 300. The board also comprises vias and interconnects for coupling metal lines within the board 200, for example, the second and the third board metal lines 202 and 204 are coupled through board via 203. The first, the second, and the third board metal lines 201, 202 and 204 comprise copper in one embodiment. In various embodiments, the board 200 comprises multiple levels of metal lines, for example, further metal lines disposed over the third metal lines 204. In one embodiment, the third metal lines 204 comprise the upper level metal line of the board 200.

FIG. 11*b* illustrates a top view along the line 11*b* of FIG. 11*a*. As illustrated in FIG. 11*b*, the board 200 and chip 300 are coupled through functional circuit interposers 340 and RF shield interposers 350. The functional circuit interposers 340 couple the functional circuitry of the chip 300 with metal lines on the board 200 coupled to operating nodes. The functional circuit interposers 340 are formed over the active circuitry including the RF component 1. In various embodiments, the functional circuit interposers 340 and the RF shield interposer 350 comprise a solder ball, a copper pillar, or other interconnecting structures. The edge RF shield interposer 350*a* is optional and formed only if the RF shield 8 is formed in the underlying chip 300 around the edges of the chip 300.

Referring to FIG. 11*c*, the third board metal lines 204 on the upper level of the board 200 are illustrated. Also illustrated in FIG. 11*c* are the second board metal lines 202 disposed under the third board metal lines 204 and the first board metal lines 201 used to build the RF-shield.

In various embodiments, the uppermost metal level (fifth metal level M5) of the chip 300 over the RF circuit 1 is used for on chip wiring. Using a part of the board 200 allows chip metallization to be used for wiring active circuitry of the chip 300. Although the RF shield 8 of the board 200 comprises coarse wiring, the distance between the metal lines of the board 200 is sufficient to provide adequate RF protection.

The board 200, in various embodiments, comprises any suitable substrate used for printed circuit boards. In various embodiments, the thickness of the board 200 varies from about 0.5 mm to about 3 mm, while the thickness of the metal lines embedded (e.g. first metal lines 201) on the board 200 varies from about 5 um to about 100 um. In various embodiments, adjacent metal lines in the board are coupled by microvias, for example, vias comprising a diameter from about 20 um to about 100 um. In some embodiments, large through holes may couple adjacent metal lines, the large through holes comprising diameters from about 100 um to about 500 um.

Figure 12:
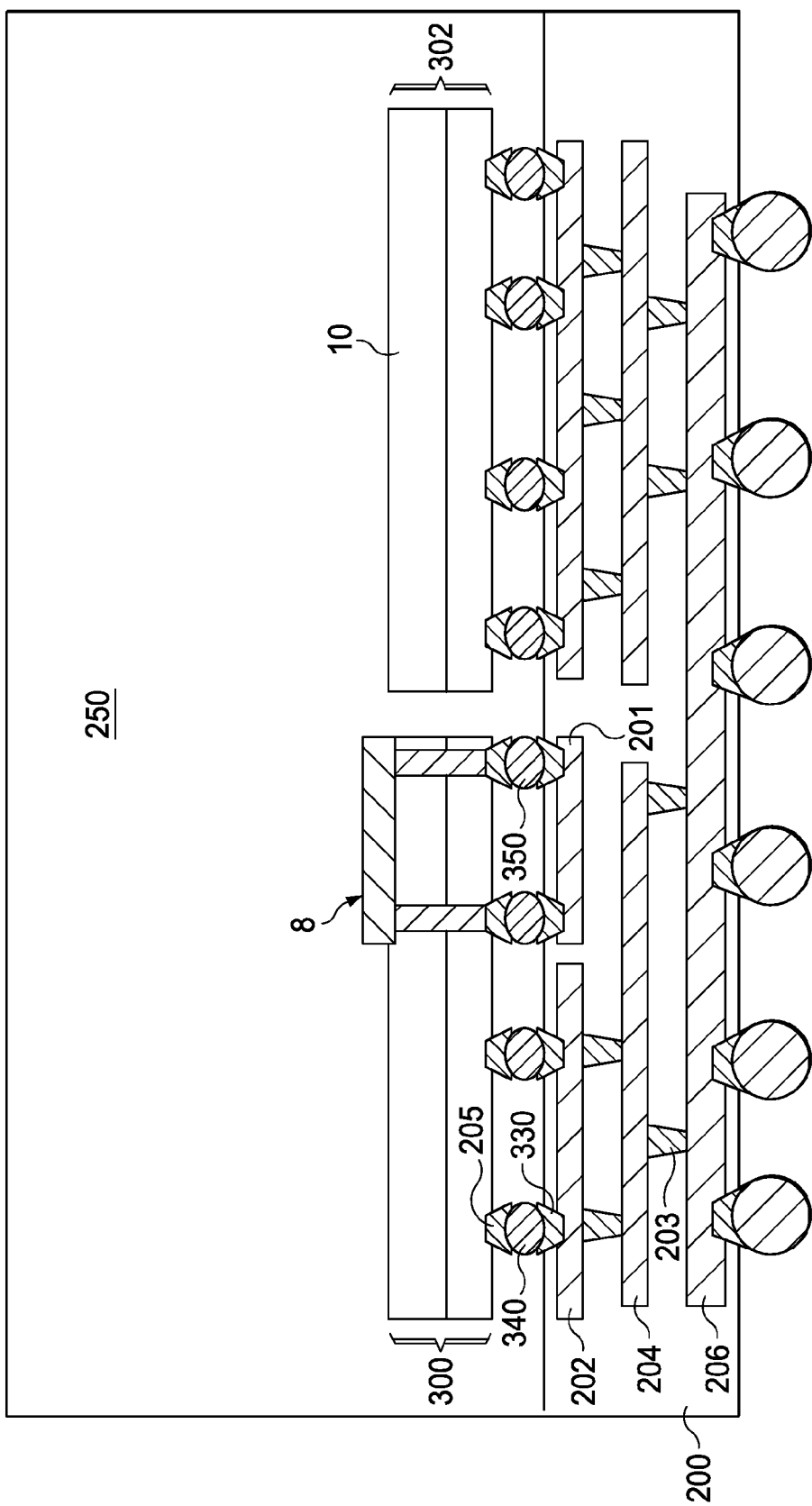
FIG. 12 illustrates a structural embodiment showing an RF shield comprising both on-chip and off-chip components.

An embodiment of the invention using a combined on-chip and off-chip RF shield is illustrated using FIG. 12 in a multi-chip embodiment. A chip 300 comprising RF circuitry is packaged adjacent to an adjacent chip 302, for example, not comprising any RF circuit. However, the adjacent chip 302 comprises circuitry sensitive to electromagnetic radiation. In various embodiments, the RF shield 8 formed partly on-chip and partly off-chip on the board 200 shields the sensitive circuits on the chip 300 as well as on the adjacent chip 302.

As illustrated in FIG. 12, the RF shield 8 is formed from the back side of the substrate 10, and through the substrate 10 and over the substrate 10 and through the under bump metallization 330 and the RF shield interposers 350. The off-chip part of the RF shield 8 is formed partly on the board 200 as, for example, described in the previous embodiment.

The board comprises metal lines disposed over multiple layers and coupled through board vias 203, in one embodiment. A first metal line 201 is coupled through the RF shield 8 and formed on the first level of the board 200. The second, the third, and the fourth metal lines 202, 204, and 206 are coupled to active circuitry on the chip 300 and adjacent chip 302. A molding compound 250 is disposed over the substrate 10 and the board 200 forming the complete package.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A chip package comprising: a semiconductor chip comprising a first semiconductor component disposed in a workpiece; a board coupled to the semiconductor chip; and a RF shield comprising a first part disposed on the semiconductor chip, and a second part disposed on the board, the RF shield blocking transmission of radio frequency electromagnetic radiation to and from the first semiconductor component; wherein the first part of the RF shield comprises: a vertical shield disposed in a second region of the workpiece, the second region surrounding the first region; and a bottom shield disposed on the back side of the workpiece; wherein the vertical shield comprises metallization layers and through substrate conductors; wherein the second part of the RF shield comprises: interposers disposed above a second region of the workpiece, the second region surrounding the first region; and pads on the board and the semiconductor chip coupling to the interposers, wherein the interposers and pads on the board and the system semiconductor chip form a vertical shield.

2. The chip package of claim 1, wherein the first part of the RF shield comprises:
a vertical shield disposed in a second region of the workpiece, the second region surrounding the first region; and
a bottom shield disposed on the back side of the workpiece.

3. The chip package of claim 2, wherein the vertical shield comprises metallization layers and through substrate conductors.

4. The Chip package of claim 1, wherein the vertical shield is disposed through the workpiece.

5. The chip package of claim 4, wherein the vertical shield is further disposed through metallization layers disposed over the workpiece.

6. The chip package of claim 1, wherein the vertical shield is disposed through metallization layers disposed over the workpiece but not through the workpiece.

7. The chip package of claim 1, wherein the vertical shield is partially disposed through metallization layers disposed over the workpiece and partially disposed through the workpiece.

8. The chip package of claim 1, wherein the interposers comprise solder bumps, or copper pillars.

9. The chip package of claim 1, wherein the second part of the RF shield comprises:
metal lines disposed on the board, the metal lines disposed over the first region of the workpiece, wherein the metal lines form a top shield over the first component.

10. The chip package of claim 9 further comprising:
second metal lines coupled to active devices on the first component, the second metal lines disposed over the first metal lines.

11. The chip package of claim 1, wherein the RF shield is coupled to a ground potential node.

12. The chip package of claim 1, wherein the first semiconductor component comprises a RF component.

13. The chip package of claim 1, wherein the semiconductor chip further comprises a second semiconductor component, the second semiconductor component and the first semiconductor component sharing a common boundary.

14. The chip package of claim 13, wherein the second semiconductor component comprises a digital logic component.

15. The chip package of claim 7, wherein the second semiconductor component comprises a memory component.

16. The chip package of claim 1, wherein the RF shield comprises a low resistivity metal comprising a metal selected from the group consisting of copper, aluminum, gold, silver, platinum, tungsten, and combinations or alloys thereof.

17. The chip package of claim 1, wherein the first part of the RF shield comprises:
conductive features disposed under an insulating layer, the insulator layer disposed within the workpiece.

18. The chip package of claim 17, wherein the conductive features comprise balloon shaped portions, the balloon shaped portions forming part of a horizontal shield.

19. The chip package of claim 1, wherein the workpiece comprises a semiconductor on insulator (SOT) substrate, the SOI comprising an insulator layer disposed on a semiconductor substrate, and a semiconductor layer disposed on the insulator layer.

20. The chip package of claim 19, wherein the RF shield comprises a layer of silicide disposed under the insulator layer.

21. The chip package of claim 19, wherein the RF shield comprises a doped layer disposed under the insulator layer.

22. A multi chip package comprising:
a first chip comprising first circuitry; a RF shield enclosing the first circuitry of the first chip, the RF shield comprising a first part and a second part, the firs part being disposed within the first chip, wherein the RF shield is coupled to a ground potential node; a second chip disposed adjacent the first chip; and a board coupled to the first chip and to the second chip, wherein the second part of the RF shield is disposed on the board; wherein the first part of the RF shield comprises: a vertical shield disposed around the first circuitry; and a bottom shield disposed on the back side of the first chip, wherein the bottom shield is disposed only under the first circuitry.

23. The chip package of claim 22, wherein the vertical shield comprises metallization layers and through substrate conductors.

24. The chip package of claim 22, wherein the second part of the RF shield comprises:
interposers disposed above a second region of the workpiece, the second region surrounding the first region;
first pads on the board coupling to the interposers; and
second pads on the system on chip coupling to the interposers, wherein the interposers and the first and the second pads form a vertical shield.

25. The chip package of claim 24 further comprising first metal lines disposed on the board, the first metal lines disposed over the first circuitry of the first chip, wherein the first metal lines form a top shield over the RF component.

26. The chip package of claim 22 further comprising second metal lines coupled to active devices on the RF component, the second metal lines disposed over the first metal lines.

27. The chip package of claim 26, wherein the interposers comprise solder bump, or copper pillars.

28. The chip package of claim 22, wherein the second chip comprises circuitry sensitive to radio frequency radiation, and wherein the RF shield of the first chip protects the sensitive circuitry on the second chip.

29. A multi chip package comprising:
a first chip comprising first circuitry; a RF shield enclosing the first circuitry of the first chip, the RF shield comprising a first part and a second part, the first part being disposed within the first chip; a second chip disposed adjacent the first chip; and a board coupled to the first chip and to the second chip, wherein the second part of the RF shield is disposed on the board, wherein the RF shield blocks transmission of electromagnetic waves between the first chip and the second chip; wherein the first part of the RF shield comprises: a vertical shield disposed around the first circuitry; and a bottom shield disposed on the back side of the first chip, wherein the bottom shield is disposed only under the first circuitry, wherein the vertical shield comprises metallization layers and through substrate conductors; wherein the second part of the RF shield comprises: Interposers disposed above a second region of the workpiece, the second region surrounding the first region; first pads on the board coupling to the interposers; and second pads on the System on chip coupling to the interposers, wherein the interposers and the first and the second pads form a vertical shield, first metal lines disposed on the board, the first metal lines disposed over the first circuitry of the first chip, wherein the first metal lines form a top shield over the RF component.

30. The multi chip package of claim 29, wherein the first circuitry comprises a radio frequency circuit.

* * * * *

UNITED STATES PATENT AND TRADEMARK OFFICE
CERTIFICATE OF CORRECTION

PATENT NO.       : 7,948,064 B2  
APPLICATION NO.  : 12/242698  
DATED            : May 24, 2011  
INVENTOR(S)      : Barth et al.

Page 1 of 1

It is certified that error appears in the above-identified patent and that said Letters Patent is hereby corrected as shown below:

In Col. 9, line 56-61, claim 1, delete "wherein the first part of the RF shield comprises: a vertical shield disposed in a second region of the workpiece, the second region surrounding the first region; and a bottom shield disposed on the back side of the workpiece; wherein the vertical shield comprises metallization layers and through substrate conductors;".

In Col. 10, line 23, claim 8, delete "bumps".

In Col. 10, line 45, claim 15, delete "claim 7" and insert --claim 13--.

In Col. 10, line 59, claim 19, delete "(SOT)" and insert --(SOI)--.

In Col. 11, line 4, claim 22, delete "firs" and insert --first--.

Signed and Sealed this  
Tenth Day of July, 2012

David J. Kappos  
*Director of the United States Patent and Trademark Office*